(12) United States Patent
Saito et al.

(10) Patent No.: US 6,747,346 B2
(45) Date of Patent: Jun. 8, 2004

(54) CONTAINER FOR SEMICONDUCTOR SENSOR, MANUFACTURING METHOD THEREFOR, AND SEMICONDUCTOR SENSOR DEVICE

(75) Inventors: Kazunori Saito, Nagano (JP); Kimihiro Ashino, Nagano (JP); Katsumichi Ueyanagi, Nagano (JP)

(73) Assignee: Fuji Electric Co., Ltd. (JP)

( * ) Notice: Subject to any disclaimer, the term of this patent is extended or adjusted under 35 U.S.C. 154(b) by 71 days.

(21) Appl. No.: 10/121,431

(22) Filed: Apr. 12, 2002

(65) Prior Publication Data
US 2002/0180019 A1 Dec. 5, 2002

(30) Foreign Application Priority Data
Apr. 12, 2001 (JP) ........................ 2001-114330

(51) Int. Cl.[7] ................. H01L 23/12; H01L 23/02; H01L 23/22
(52) U.S. Cl. ............... 257/684; 257/678; 257/704; 257/780; 257/782; 257/783; 257/784
(58) Field of Search ................. 257/704, 678, 257/780, 782, 783, 784, 684

(56) References Cited

U.S. PATENT DOCUMENTS

| | | | | |
|---|---|---|---|---|
| 5,256,901 A | * | 10/1993 | Ohashi et al. | 257/680 |
| 5,459,351 A | * | 10/1995 | Bender | 257/417 |
| 5,889,323 A | * | 3/1999 | Tachibana | 257/704 |
| 6,011,304 A | * | 1/2000 | Mertol | 257/706 |
| 6,282,096 B1 | * | 8/2001 | Lo et al. | 361/704 |
| 6,313,525 B1 | * | 11/2001 | Sasano | 257/704 |
| 6,509,636 B1 | * | 1/2003 | Tsai et al. | 257/678 |
| 6,525,405 B1 | * | 2/2003 | Chun et al. | 257/704 |

FOREIGN PATENT DOCUMENTS

JP 5-164647 6/1993

* cited by examiner

Primary Examiner—Jasmine Clark
(74) Attorney, Agent, or Firm—Rossi & Associates

(57) ABSTRACT

A container for a semiconductor sensor includes a housing body and a cover. On the upper surface of the housing body outer than the pressure detection room, a groove is provided to trap the gel protective material overflowed from the pressure detection room. The housing body and the cover are respectively provided with a recess portion and a protruding portion, engaging with each other, to secure adhesion of the cover to the housing body. The clearance between the housing body and the lead terminal is filled with filler that is formed by applying and curing polyimide resin. The sensor-mounting pit is provided with a relief portion for releasing excess portion of the adhesive, which is used for adhering the pedestal. The excess adhesive is released into the relief portion, to suppress creeping up of the adhesive.

50 Claims, 16 Drawing Sheets

CONTAINER FOR SEMICONDUCTOR SENSOR, MANUFACTURING METHOD THEREFOR, AND SEMICONDUCTOR SENSOR DEVICE

FIELD OF THE INVENTION

The present invention relates to a container for a semiconductor sensor and a method for manufacturing thereof, and a semiconductor sensor device. In particular, the present invention relates to technology that is favorably applied to a pressure sensor for an automobile.

BACKGROUND OF THE INVENTION

A pressure sensor device for an automobile generally uses a semiconductor pressure sensor chip, in which piezoresistance effect is utilized. The semiconductor pressure sensor comprises a plurality of bridge-connected semiconductor strain gauges disposed on a diaphragm of single crystal silicon, for example. The strain gauge is made of a material exhibiting piezoresistance effect. Gauge resistance of the semiconductor strain gauges varies with deformation of the diaphragm due to the pressure variation. The resistance variation is taken out from the bridge circuit as a voltage signal.

FIG. 16 is a cross sectional view of a conventional semiconductor pressure sensor device. The pressure sensor device comprises a housing body 11 containing a semiconductor pressure sensor chip 13 in a sensor mounting pit 12 that is a well-shaped portion formed in the housing body, and a cover 14 that covers the housing body. The pressure sensor chip 13 is electrically connected through bonding wires 16 to lead terminals 15 for leading out. The lead terminals 15 that are lead frames are integrally insert-molded penetrating through the housing body 11. The surface of the pressure sensor chip 13 and the bonding wire 16 are protected by gel protective material 17 from adhesion of contaminant included in the medium for pressure measurement.

The pressure sensor chip 13 is fixed on a pedestal 18 made of glass. The pedestal 18 is provided for preventing the thermal expansion of the housing body 11 from adversely affecting the pressure sensor chip 13. Accordingly, certain thickness is required by the pedestal. The pedestal 18 is glued to the bottom of the sensor-mounting pit 12 with adhesive 19. The cover 14 has a pressure inlet hole 21 that connects a space, of which the pressure is to be measured, and a pressure detection room 20 located between the housing body 11 and the cover 14.

However, in the conventional pressure sensor device as described above, the gel protective material 17 may overflow or ooze out from the pressure detection room 20 before attaching the cover 14 to the housing body 11. The overflow causes defective adhesion of the cover 14 with the housing body 11, which raises problems of insufficient adhesion strength and imperfect gas-tightness.

Because of large difference in the amounts of thermal expansion in the housing body 11 of resin and the lead terminal 15, a slight clearance may be generated between the housing body 11 and the lead terminal 15 due to the shrinkage after the insert-molding. This clearance causes leakage of pressure in calibration of measuring pressure value in the manufacturing process of the pressure sensor device. That is a trouble to interfere with correct calibration. In addition, the leakage of the gel protective material 17 through the clearance causes degradation of the product.

The sensor-mounting pit 12 has a tapered shape being narrower in the bottom region, in order to facilitate mounting a sensor unit consisting of a pressure sensor chip 13 and the pedestal 18. Along the narrow gap between the sensor-mounting pit 12 and the pedestal 18, adhesive 18 may creep up by capillary action or thixotropy. The creeping up of the adhesive 19 reduces effective thickness of the pedestal 18, hindering enough stress relaxation. Thus, a problem is raised that performance of the pressure measurement is degraded by the influence of thermal expansion of the housing body 11.

The present invention has been made in view of the above problems because it would be desirable to avoid defective adhesion of the cover due to overflow of the gel protective material. it would further be desirable to get rid of a clearance between the housing body and the lead terminal. Still further, it would be desirable to suppress creeping up of the adhesive along the pedestal that fixes the semiconductor sensor element.

SUMMARY OF THE INVENTION

In accordance with the present invention, a container for a semiconductor sensor of the present invention comprises a groove on a surface portion of a housing body inside of a position contacting with a cover and outside of a housing hollow so that the groove is disposed surrounding the housing hollow and traps the gel protective material that overflows from the housing hollow. According to the construction of the invention, the overflowed gel protective material is trapped within the groove of the housing body.

A housing body of a container for a semiconductor sensor according to the present invention is provided with a recess portion or a protruding portion surrounding outside of a housing hollow on a portion of the housing body that contacts with a cover, while the cover is provided with a protruding portion or a recess portion that engages the recess portion or the protruding portion of the housing body respectively. According to this feature of the present invention, the recess portion or the protruding portion of the housing body engages the protruding portion or the recess portion of the cover, when the cover is adhered to the housing body.

In a container for a semiconductor sensor of the present invention, clearance between an outer surface of the housing body and a lead terminal is filled with filler such as resin. Clearance between the lead terminal and the housing body at the interior region of the housing body is filled by enclosing a portion of the lead terminal that contacts to an inner part of the housing body with filler such as resin. According to this feature of the invention, a gap between the housing body and the lead terminal is filled with filler.

In a container for a semiconductor sensor of the invention, the inner portion of the housing body is provided with a relief portion for excess adhesive to be released, the adhesive being supplied for fixing a sensor element in the housing hollow. According to this feature of the invention, the excess adhesive in fixing the sensor element runs out to the relief portion.

BRIEF DESCRIPTION OF THE DRAWINGS

The invention will now be described with reference to certain preferred embodiments thereof and the accompanying drawings, wherein.

DETAILED DESCRIPTION OF THE PREFERRED EMBODIMENTS

The present invention will be described in detail with respect to the examples of preferred embodiments of the invention that are applied to pressure sensor devices, referring to the accompanying drawings.

First Embodiment of the Invention

Figure 1:
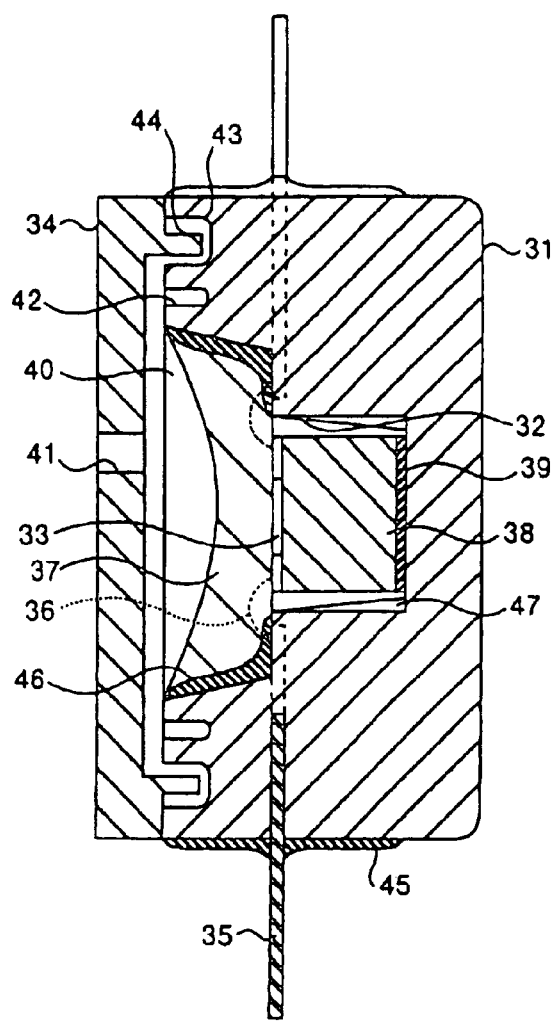
FIG. 1 is a cross-sectional view showing a construction of a semiconductor sensor device according to the first embodiment of the present invention.

FIG. 1 is a cross sectional view showing a structure of a semiconductor sensor device of first embodiment of the invention. This pressure sensor device comprises a housing body 31 made of resin that is provided with a housing hollow. A semiconductor pressure sensor chip 33, that is a sensor element, is mounted on a pedestal 38 made of glass, for example, fixed with adhesive 39 in a sensor mounting pit 32, which is a part of the housing hollow. The sensor chip 33 is electrically connected to lead terminals 35 that are lead frames, with bonding wires 36. Gel protective material 37 protects the surface of the sensor chip 33 and the bonding wires 36. A pressure detection room 40 is formed by adhering a cover 34 to the housing body 31. The pressure detection room 40 is connected through a pressure inlet hole 41 drilled through the cover 34 to a space, on which pressure is to be measured. A container for a semiconductor sensor comprises the housing body 31 and the cover 34.

Figure 2:
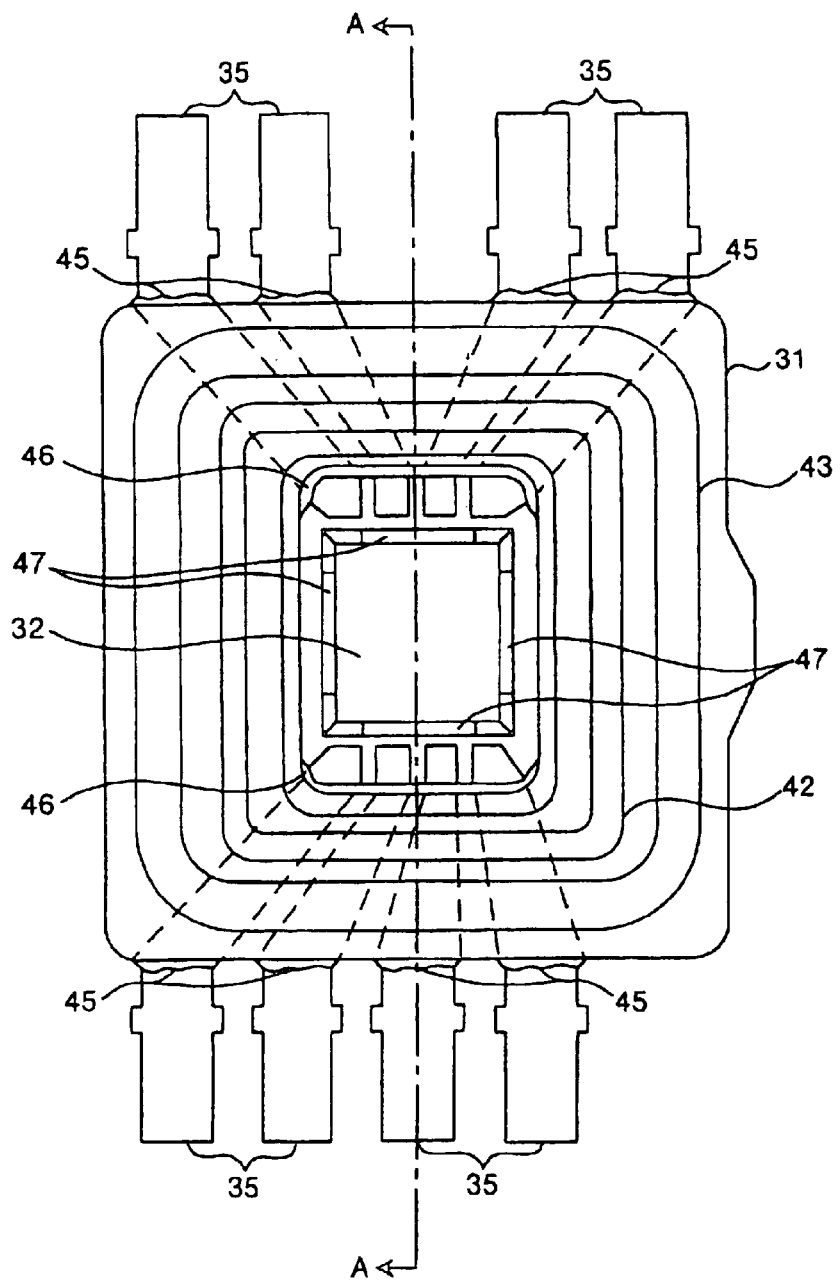
FIG. 2 is a top view showing a construction of a container for a semiconductor sensor according to the first embodiment of the present invention.
Figure 3:
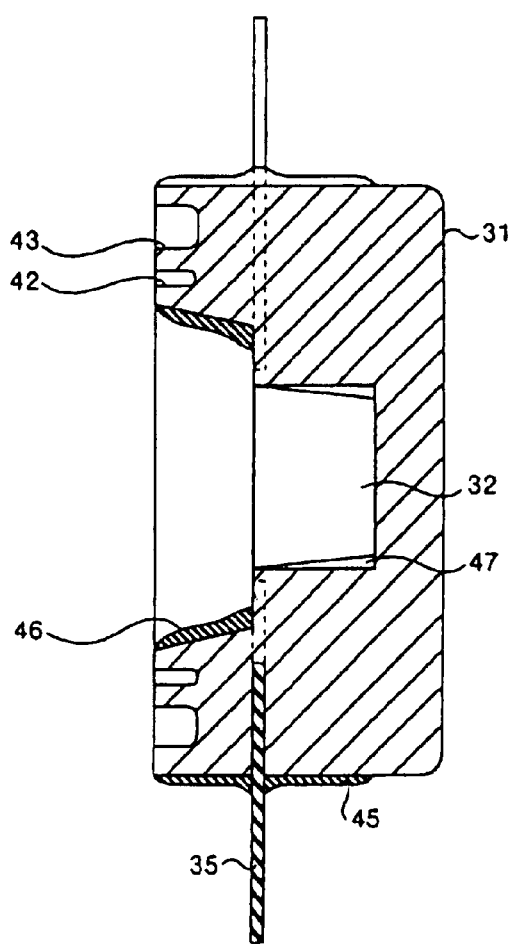
FIG. 3 is a cross sectional view along the line A—A in FIG. 2.

As shown in FIGS. 2 and 3, the housing body 31 is provided with a groove 42 surrounding the pressure detection room 40, the groove being disposed in the outside of the pressure detection room 40 and in the inside of a portion of the housing body contacting the cover 34. The groove 42 is provided for trapping gel protective material 37 that overflows or oozes out from the pressure detection room 40. Width and depth of the groove 42 are appropriately selected corresponding to the estimated amount of the gel protective material 37 that will overflow or ooze out. If the gel protective material 37 overflows or oozes out from the pressure detection room 40 before putting the cover 34, the gel protective material 37 is trapped by the groove 42, being prevented from adhering to the portion of the housing body on which the cover 34 contacts. Two or more grooves may be provided for trapping the overflowed or oozed out gel protective material 37.

The housing body 31 is provided with a recess portion 43 formed surrounding the pressure detection room 40. The cover 34, on the other hand, is provided with a protruding portion 44 that engages the recess portion 43 of the housing body 31 and surrounds the pressure detection room 40 when the cover 34 is put on the housing body 31. When adhesive is applied to the recess portion 43 of the housing body 31 and the cover 34 is put on the housing body 31, the protruding portion 44 of the cover 34 engages the recess portion 43 of the housing body 31 and the two are adhered. Relative size of the recess portion 43 and the protruding portion 44 may be either in the condition, in which the protruding portion 44 is inserted to the recess portion 43 with a certain play, or in the situation, in which the two are just joined without clearance.

A resin exhibiting fluidity, such as polyimide, is applied to the location, at which each lead terminal 35 projects out from the outer surface of the housing body 31. The filler 45 is formed by curing the resin. The filler 46 is also provided in the location, at which each lead terminal 35 projects out towards the sensor-mounding pit 32 for wire-bonding to the sensor chip 33. The filler 46 is likewise formed by applying fluid resin, such as polyimide, and curing the resin.

Adhesive such as polyimide resin adhere to a metal surface with remarkably strong adhesive strength, because such adhesive bonds to metal by chemical reaction. Further, the adhesive such as polyimide resin exhibits significant adhesion strength also with mold resin. Consequently, the adhesive such as polyimide resin performs as an intervening material adhering the metal to the mold resin, and the filler 45 and 46 fill the gap between the housing body 31 and the lead terminal 35.

The fillers 45 and 46 may be applied and cured to form the structure in FIGS. 2 and 3 in the process of manufacturing the housing body 31, that is, before a step of adhering a sensor unit that consists of the semiconductor pressure sensor chip 33 and the pedestal 38 fixing the sensor chip 33. Alternatively, the fillers 45 and 46 may not be formed in the process of manufacturing the housing body 31, and the fillers 45 and 46 may be applied and cured to form the structure in FIG. 1 after a step of wire-bonding between the sensor unit and the lead terminals that follows the step of adhering the sensor unit on the housing body. If only one of the filler 45 and filler 46 is enough to gain desired tight seal, another one may not be formed. When the filler 46 is applied and cured to coat the wire-bonding portion as shown in FIG. 1, the wire-bonding becomes significantly firm. To coat the wire-bonding portion with the filler 46 as shown in FIG. 1 using the housing body of FIGS. 2 and 3, a resin such as polyimide is again applied and cured after the step of adhering the sensor unit onto the housing body and the step of wire-bonding.

The housing body 31 is provided in the sensor-mounting pit 32 with a relief portion 47 in which excess portion of the adhesive 39 is released. The adhesive is used for adhering a sensor unit consisting of a semiconductor pressure sensor chip 33 and a pedestal 38 that fixes the sensor chip. The sensor-mounting pit 32 has walls with a tapered shape becoming narrower as going down toward the bottom, like a conventional sensor-mounting pit. That is, the side walls of the sensor-mounting pit 32 are inclined. A portion of each side wall is formed to be not inclined. A gap between the un-inclined portion of the side wall and the pedestal 38 performs as a space for the relief portion 47.

In the example shown in FIG. 2 and FIG. 3, the relief portion 47 is formed in the center region of each of the four side walls of the sensor-mounting pit 32, while the four corner regions have tapered shape. The relief portion may be formed in the four corner regions of the inner side walls of the sensor-mounting pit 32, the central regions being tapered. The relief portion 47 is not necessarily provided in four locations. One or more spaces for the relief portion 47 are formed corresponding to the amount of the adhesive that is estimated to be trapped in the relief portion.

Figure 4:
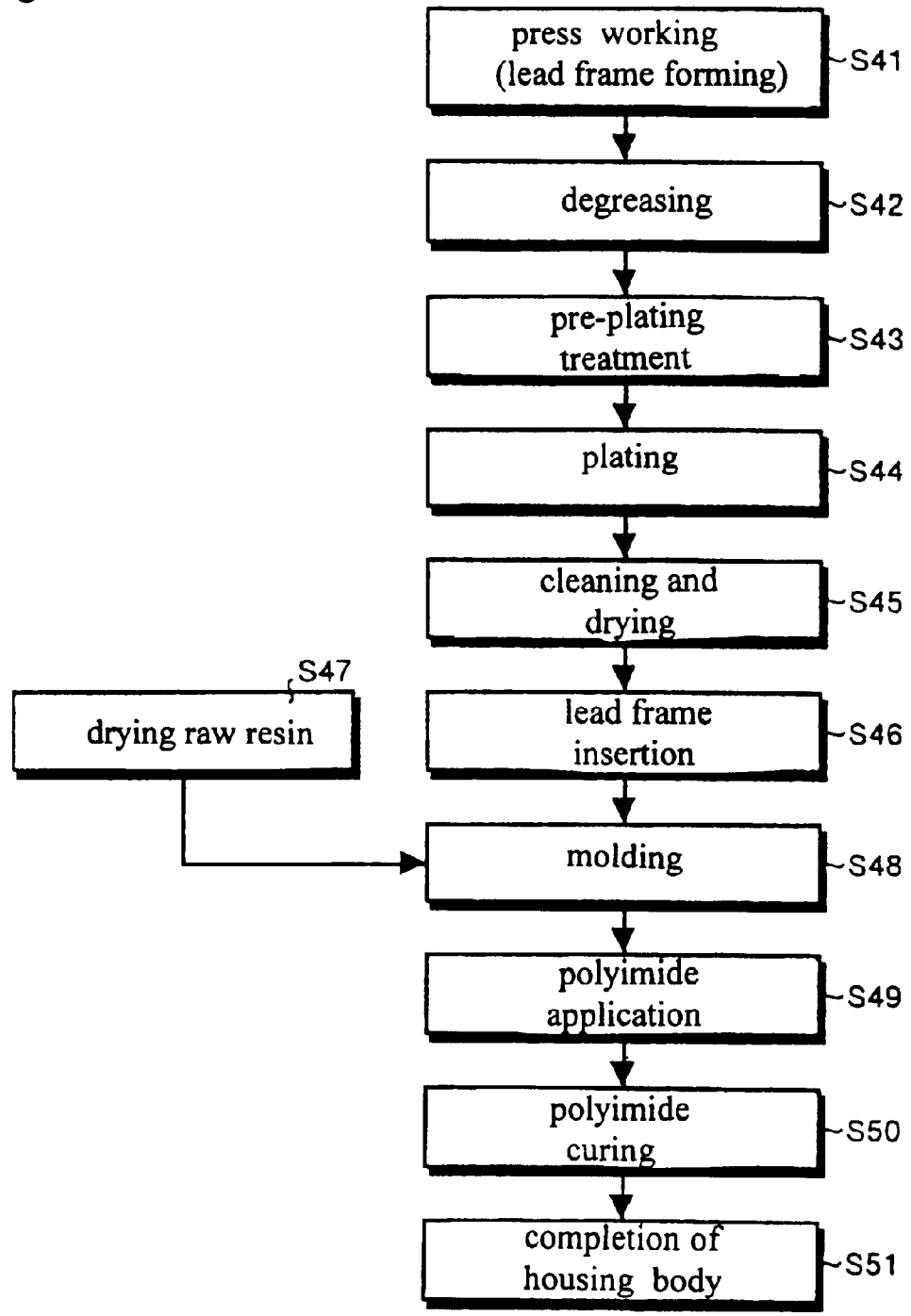
FIG. 4 is a flow diagram showing a manufacturing procedure of a housing body of a container for a semiconductor sensor illustrated in FIGS. 2 and 3.

FIG. 4 is a flow diagram showing a procedure for manufacturing a housing body 31. First, lead terminals 35 that are lead frames are formed (step S41). Then, degreasing (step S42), pre-plating treatment (step S43), plating (step S44), and cleaning and drying step (step S45) are conducted. The resulted lead frame is placed in a die (step S46). Molding resin that has been dried in advance (step S47) is injected into the die and molding is performed (step S48).

After removing the molded article from the die, fluid resin such as polyimide is applied to the clearance between the housing body 31 and the lead terminal 35 (step S49) and cured (step S50), to complete the housing body 31 (step S51). To the thus manufactured housing body 31, a sensor unit is adhered that consists of a semiconductor pressure sensor chip 33 and a pedestal 38 fixing the chip. After conducting wire bonding, gel protective material is filled, and a separately fabricated cover 34 is put on, to complete a pressure sensor device.

In the flow diagram of FIG. 4, the polyimide resin is applied (step S49) and cured (step S50) in the process of manufacturing the housing body 31, that is, before a step of adhering the sensor unit onto the housing body 31. Alternatively, the steps of applying and curing of the polyimide resin may not be conducted in the process of manufacturing the housing body 31, and the polyimide resin may be applied and cured after the steps of adhering the sensor unit onto the housing body and wire-bonding between the sensor unit and the lead terminals. When the polyimide resin is applied and cured after the wire-bonding step, the bonding portion is allowed to be coated with the polyimide resin.

According to the first embodiment as described above, if the gel protective material 37 overflows or oozes out from the pressure detection room 40, the groove 42 provided on the housing body 31 traps the gel protective material. Thus, the gel protective material is prevented from adhesion to the portion of the housing body 31 at which the cover 34 contacts. Therefore, insufficient adhesion of the cover 34 due to the overflow of the gel protective material is avoided.

In the above-described first embodiment, the housing body 31 and the cover 34 are provided with a recess portion 43 and a protruding portion 44 respectively, engaging each other. Because the recess portion 43 engages the protruding portion 44 when the cover 34 is adhered to the housing body 31, the cover 34 is reliably adhered to the housing body 31, thus avoiding imperfect gas-tightness between the housing body 31 and the cover 34.

In the above-described first embodiment, the clearance between the housing body 31 and the lead terminal 35, that is a lead frame, is filled with the filler 45 and 46, and clearance is eliminated between the housing body 31 and the lead terminal 35. Therefore, pressure leakage is avoided when calibration of the measuring pressure value is performed in the manufacturing process of a pressure sensor device, allowing accurate calibration.

Figure 5:
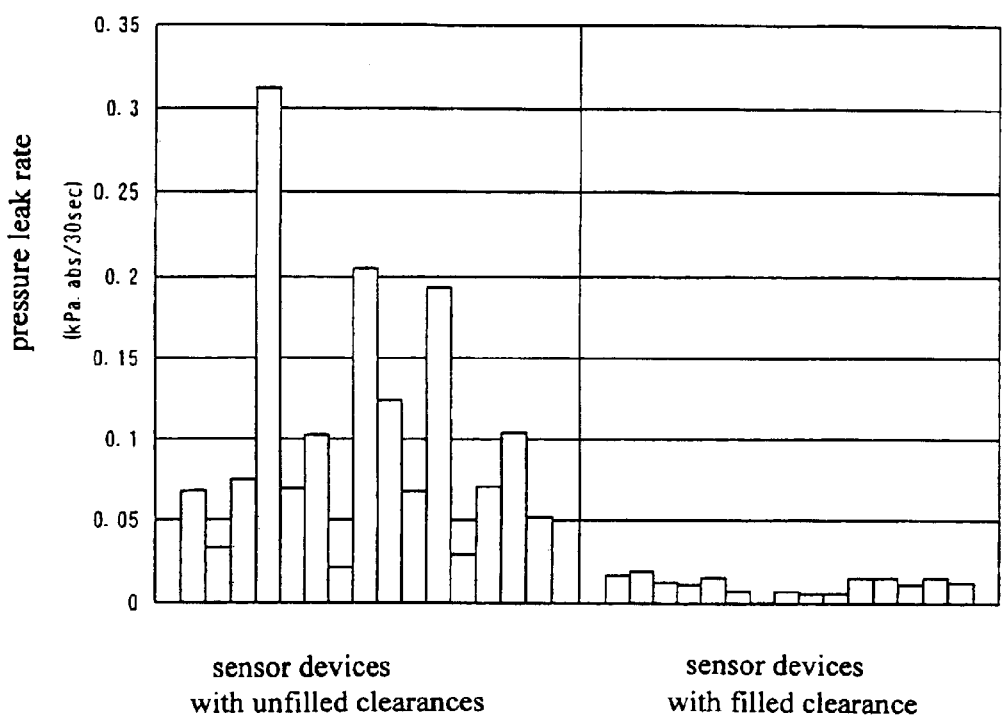
FIG. 5 is a graph comparing values of pressure leak rate in a container for a semiconductor sensor according to the first embodiment of the present invention and a conventional container for a semiconductor sensor.

FIG. 5 shows the result of measuring and comparing pressure leak rates before and after filling the clearance between the housing body and the lead frame measured on 15 sensor devices by the inventors. The measurement was conducted by giving a negative pressure of 13.3 kPa, which is equal to 88 kPa abs., in the sensor device and closing the valve at the pressure source side of the sensor device. After that, pressure rise in the sensor device during 30 seconds was measured as a pressure leak rate. It is apparent that the pressure leak rate was significantly decreased on every sensor element by filling the clearance. By filling the clearance between the housing body 31 and the lead terminal 35, escape of the gel protective material through the clearance is also avoided, thus, preventing the sensor device from degrading.

In the above-described first embodiment, the housing body is provided in the sensor mounting pit 32 with a relief portion 47 for trapping excess portion of the adhesive 39 that is supplied for adhering a sensor unit consisting of a semiconductor pressure sensor chip 33 and a pedestal 38 fixing the chip. Because the relief portion 47 traps the extruded adhesive 39, creeping up of the excess adhesive along the pedestal 38 is suppressed. Therefore, the stress relaxation effect by the pedestal 38 is fully exhibited. By suppressing the creeping up of the adhesive 39, the pedestal 38 can be made thinner than conventional, which allows reduction of the pedestal cost. When the pedestal become thinner, the housing body 31 can be also made thinner, resulting in reduced resin requirement and cost reduction as well.

Figure 6:
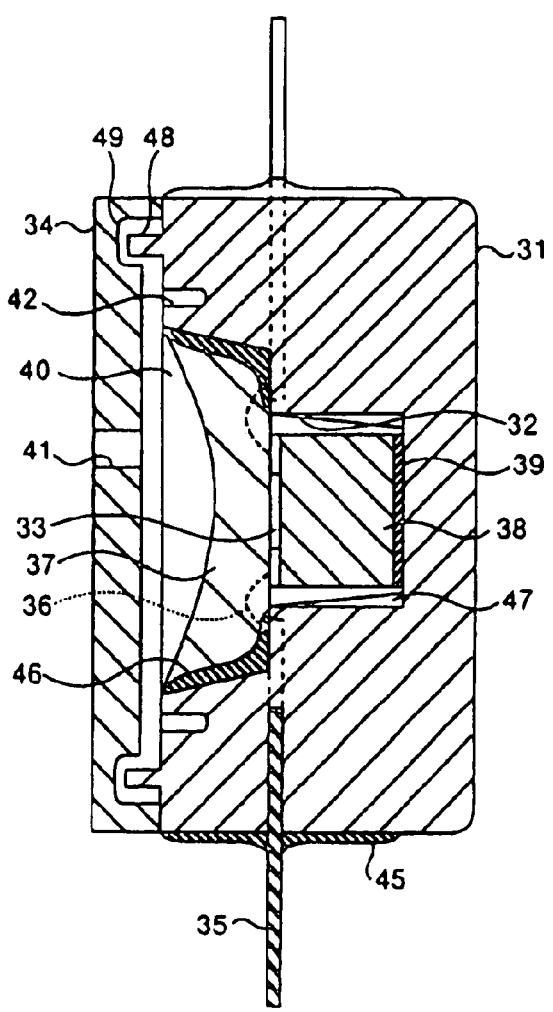
FIG. 6 is a cross-sectional view showing another construction of a semiconductor sensor device according to the first embodiment of the present invention.

Although the recess portion 43 is preferably formed on the housing body 31 and the protruding portion 44 is formed on the cover 34 and the recess and the protrusion engages each other in the first embodiment; alternatively, a recess portion 49 may be formed on the cover 34 and a protruding portion 48 may be formed on the housing body 31 engaging each other as shown in FIG. 6.

Figure 7:
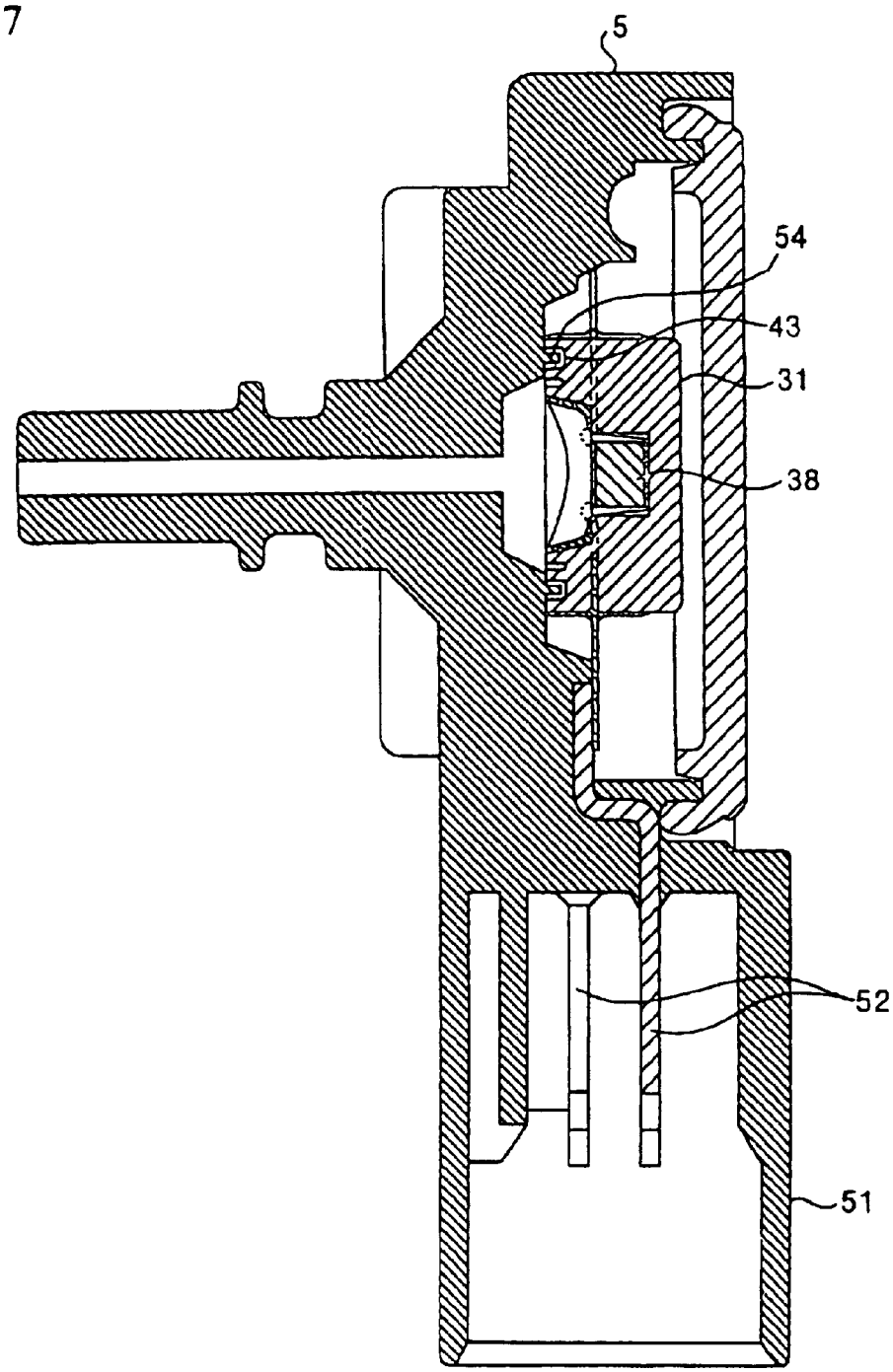
FIG. 7 is a cross-sectional view showing still another construction of a semiconductor sensor device according to the first embodiment of the present invention.

Although the cover 34 is put on the housing body 31 in the first embodiment, the housing body 31 may be adhered to an outer casing 5 as a cover, the outer casing comprising a connector 51 and terminals 52 for directly mounting to an automobile engine, for example, as shown in FIG. 7. In FIG. 7, the housing body 31 has a recess portion 43 and the outer casing 5 has a protruding portion 54 engaging each other. Conversely, the engaging protrusion and recess may be formed on the housing body 31 and the outer casing 5, respectively.

Second Embodiment

Figure 8:
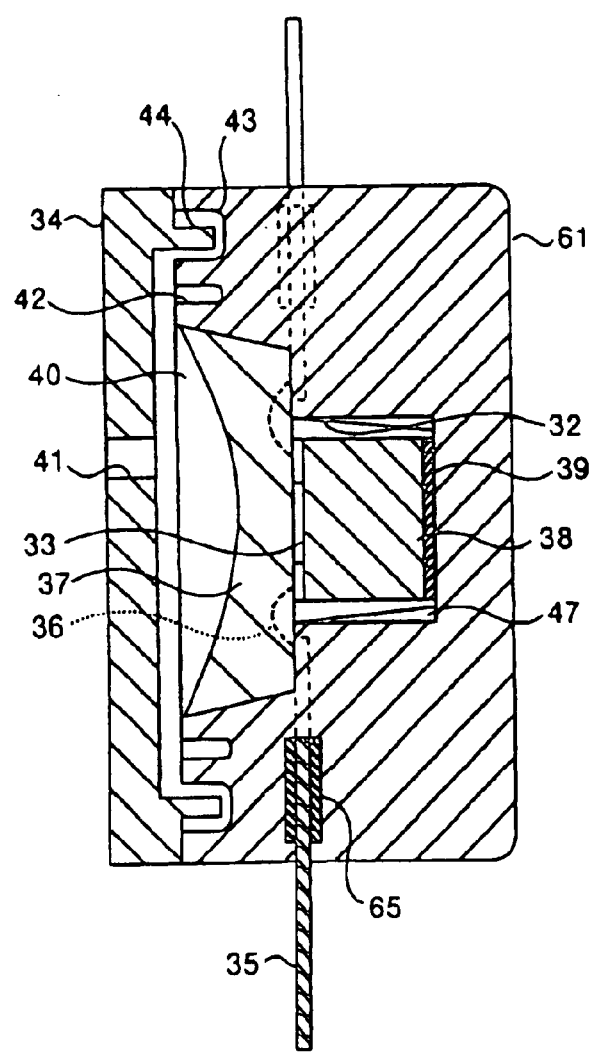
FIG. 8 is a cross-sectional view showing a construction of a semiconductor sensor device according to the second embodiment of the present invention.
Figure 9:
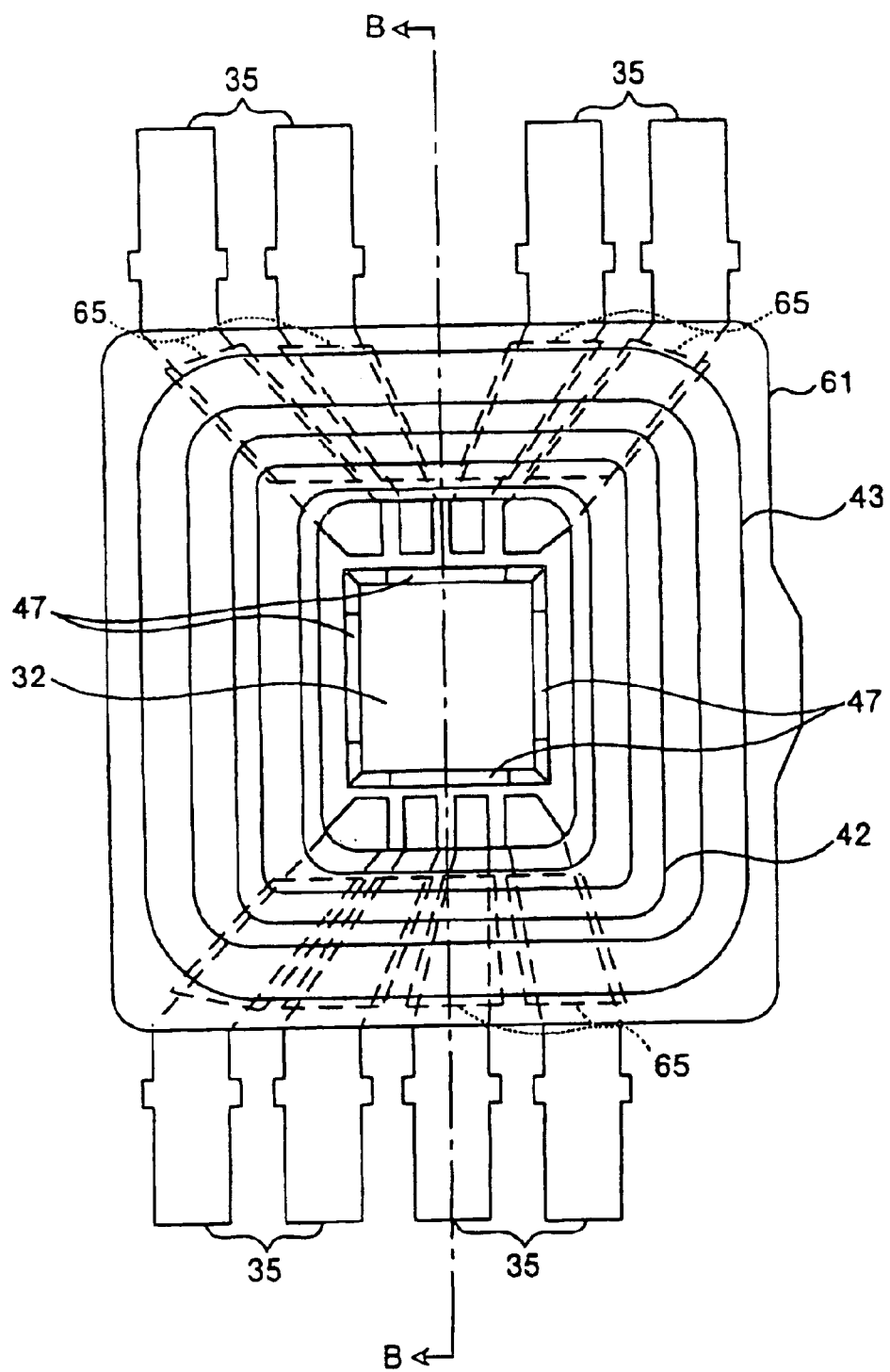
FIG. 9 is a top view showing a construction of a container for a semiconductor sensor according to the second embodiment of the present invention.
Figure 10:
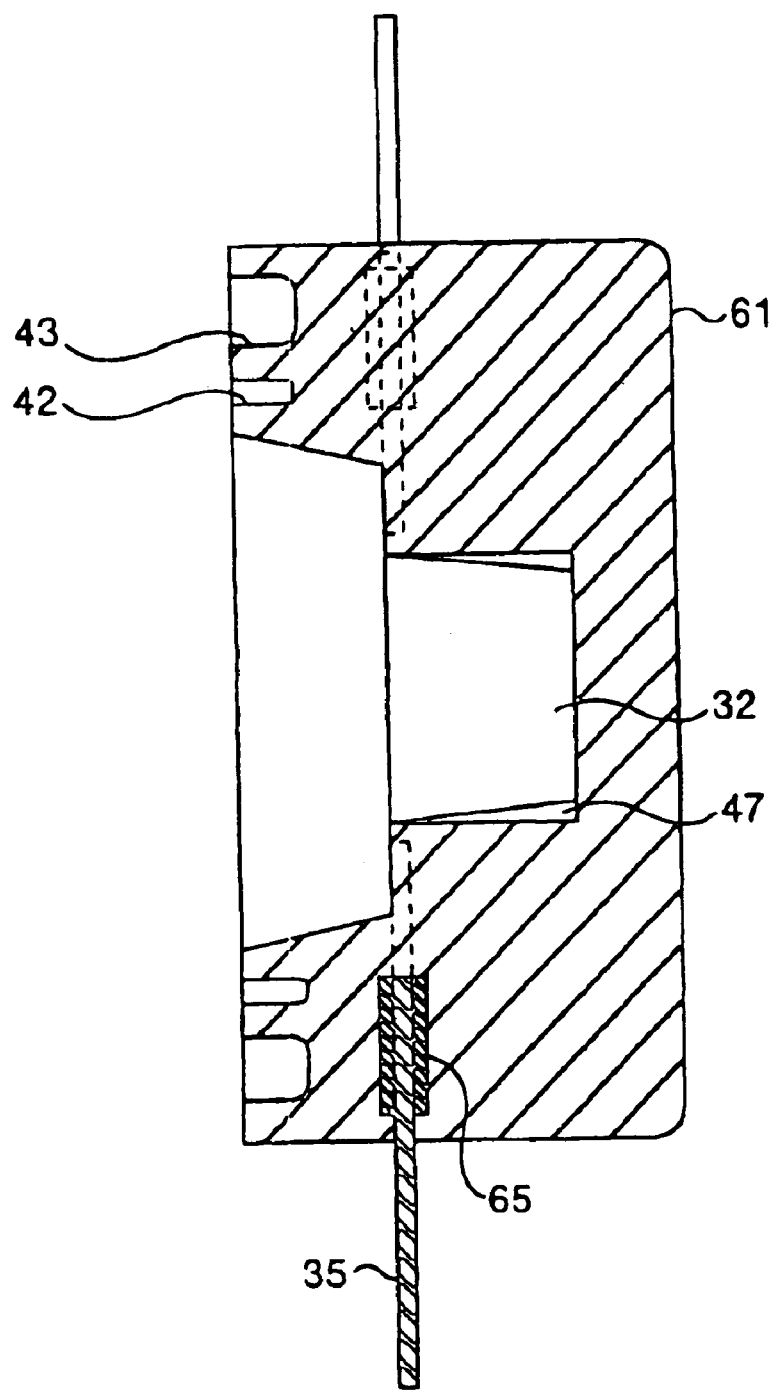
FIG. 10 is a cross sectional view along the line B—B in FIG. 9.

FIG. 8 is a cross sectional view of a semiconductor sensor device according to the second embodiment of the present invention. FIG. 9 and FIG. 10 are a top view and a cross sectional view, respectively, of a container for a semiconductor sensor of the second embodiment of the invention. The second embodiment is different from the first embodiment in the following respects. In the first embodiment, the clearance between the housing body 31 and the lead terminal 35 is filled by applying and curing polyimide resin at the places where the lead terminals exit from the housing body inward or outward and are exposed to inside or outside space of the housing body.

While, in the second embodiment, the clearance between the housing body 61 and the lead terminal 35, that is a lead frame, is filled with a filler 65 of a polyimide film that covers a portion of the lead terminal 35 embedded in the housing body 61. Other constructions are same as in the first embodiment. The same reference symbol is given to the like construction, and description is omitted.

Figure 11:
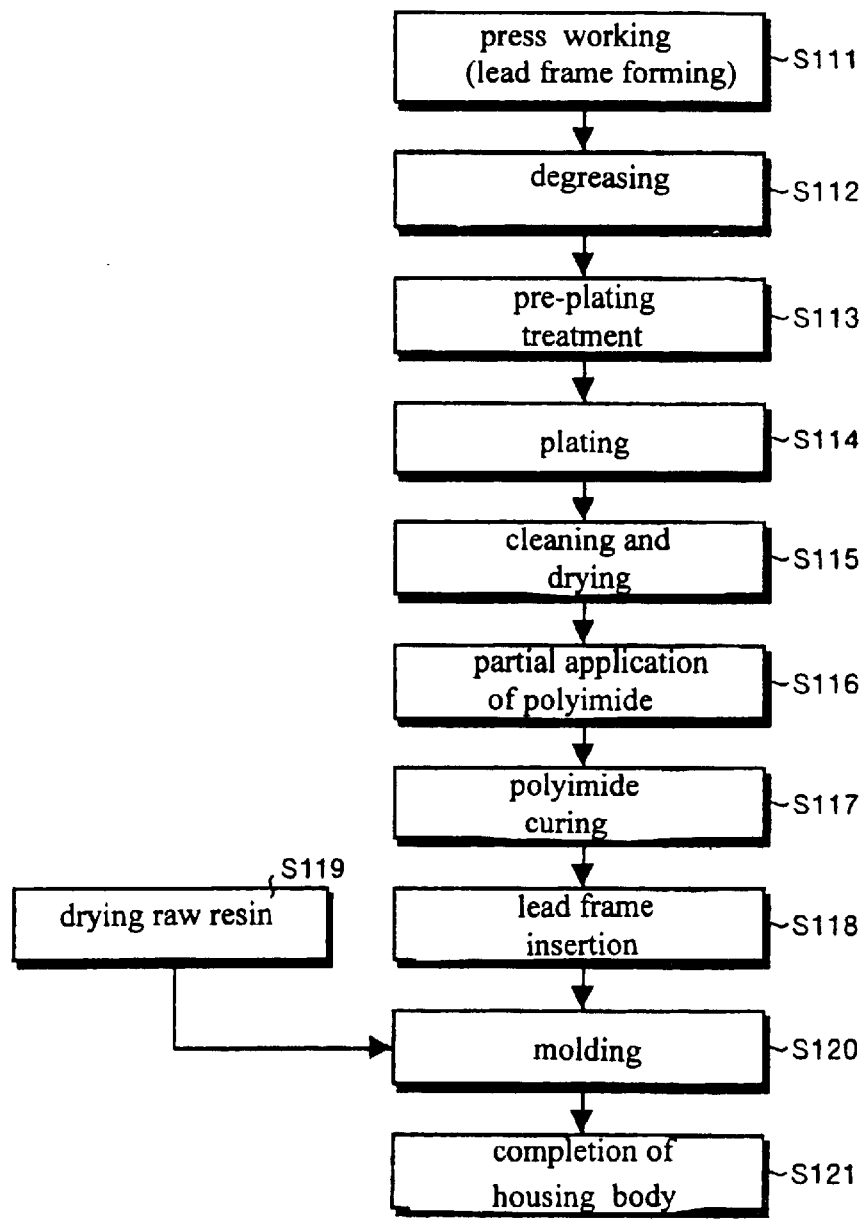
FIG. 11 is a flow diagram showing a manufacturing procedure of a housing body of a container for a semiconductor sensor illustrated in FIGS. 9 and 10.

FIG. 11 is a flow diagram showing a manufacturing procedure of a housing body 61. The steps of press working of lead frame (step S111), degreasing (step S112), pre-plating treatment (step S113), plating (step S114), and cleaning and drying step (step S115) are same as the steps in the first embodiment. After drying, polyimide resin is applied (step S116) to a portion of the lead terminal 35 that is to be embedded in the housing body 61, and cured (step S117).

The lead terminal 35 covered with a polyimide film that becomes filler 65 is placed in a die (step S118). Molding resin that has been dried separately (step S119) is injected to the die and molded (step S120). Removing from the die, a housing body 61 is completed. Molding resin that has been dried separately (step S119) is injected to the die and molded (step S120). Removing from the die, a housing body 61 is completed. To the thus manufactured housing body 61, a sensor unit is adhered that consists of a semiconductor pressure sensor chip 33 and a pedestal 38 fixing the chip. After conducting wire bonding, gel protective material 37 is filled, and a separately fabricated cover 34 is put on, to complete a pressure sensor device.

In the above-described second embodiment, clearance is eliminated between the housing body 61 and the lead terminal 35 as in the first embodiment. Therefore, pressure leakage is avoided when calibration of the measuring pressure value is performed in the manufacturing process of a pressure sensor device, allowing accurate calibration. In addition, the sensor device is prevented from degradation due to escape of the gel protective material 37.

Third Embodiment

Figure 12:
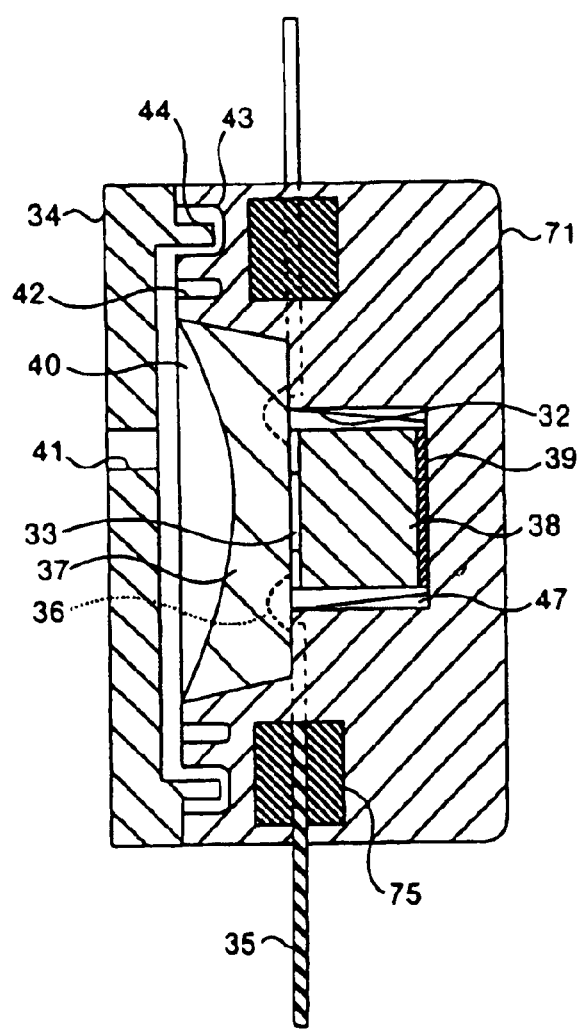
FIG. 12 is a cross-sectional view showing a construction of a semiconductor sensor device according to the third embodiment of the present invention.
Figure 13:
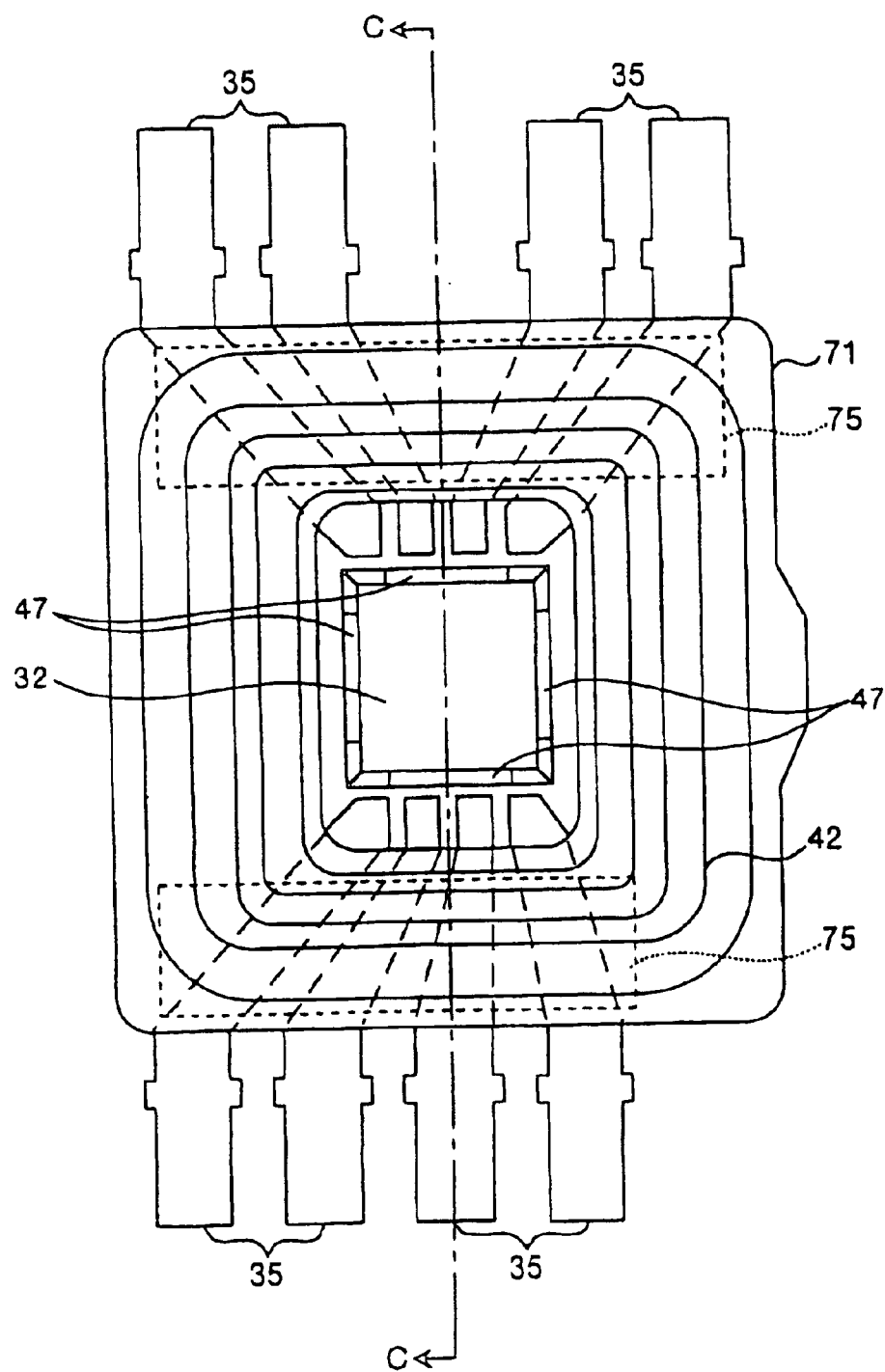
FIG. 13 is a top view showing a construction of a container for a semiconductor sensor according to the third embodiment of the present invention.
Figure 14:
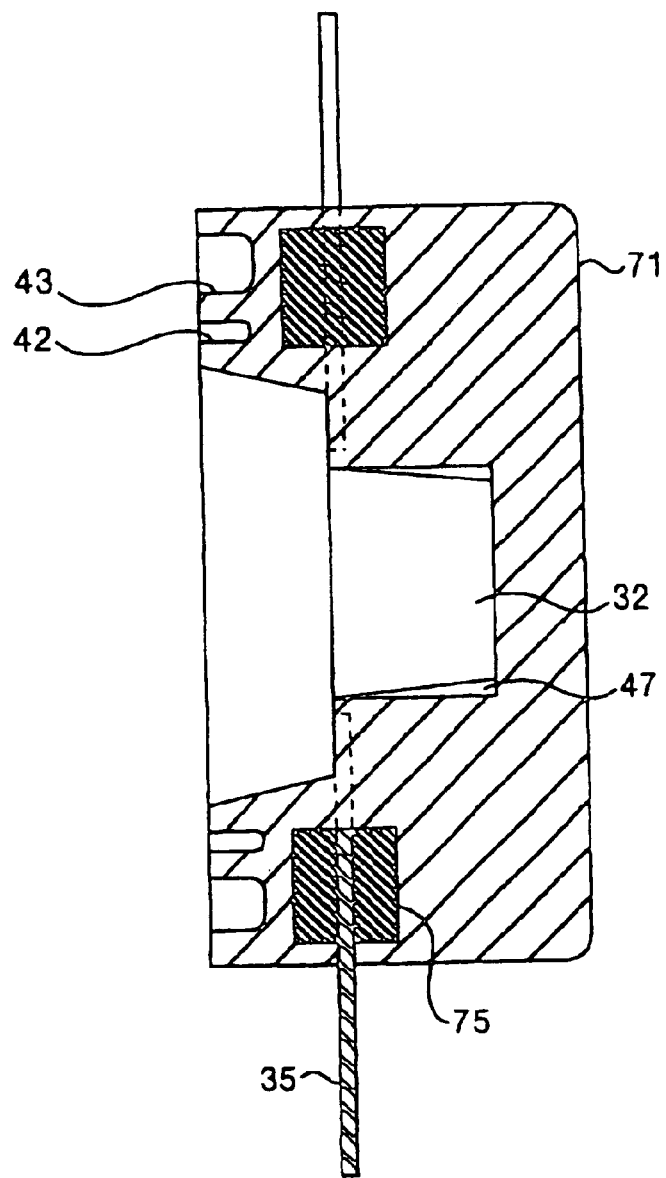
FIG. 14 is a cross sectional view along the line C—C in FIG. 13.

FIG. 12 is a cross sectional view showing a construction of a semiconductor sensor device according to the third embodiment of the present invention. FIG. 13 and FIG. 14 are a top view and a cross sectional view, respectively, showing a construction of a container of the semiconductor sensor device. The third embodiment differs from the first embodiment in the following respect. In the first embodiment, the clearance between the housing body 31 and the lead terminal 35 is filled by applying polyimide resin from the outside.

On the other hand, in the third embodiment, a portion of the lead terminal 35 that is to be embedded in the housing body 71 is first enclosed in resin, which is a step of preliminary molding. The resin for the preliminary molding is selected from silicone rubber, epoxy resin, the same resin as the molding resin of the housing body, for example a thermoplastic resin such as polyphenylene sulfide, and other resins. After the preliminary molding, the resulted article is used for molding the housing body 71, which is a step of secondary molding. Other constructions are same as in the first embodiment. The same reference symbol is given to the like construction, and description is omitted.

Figure 15:
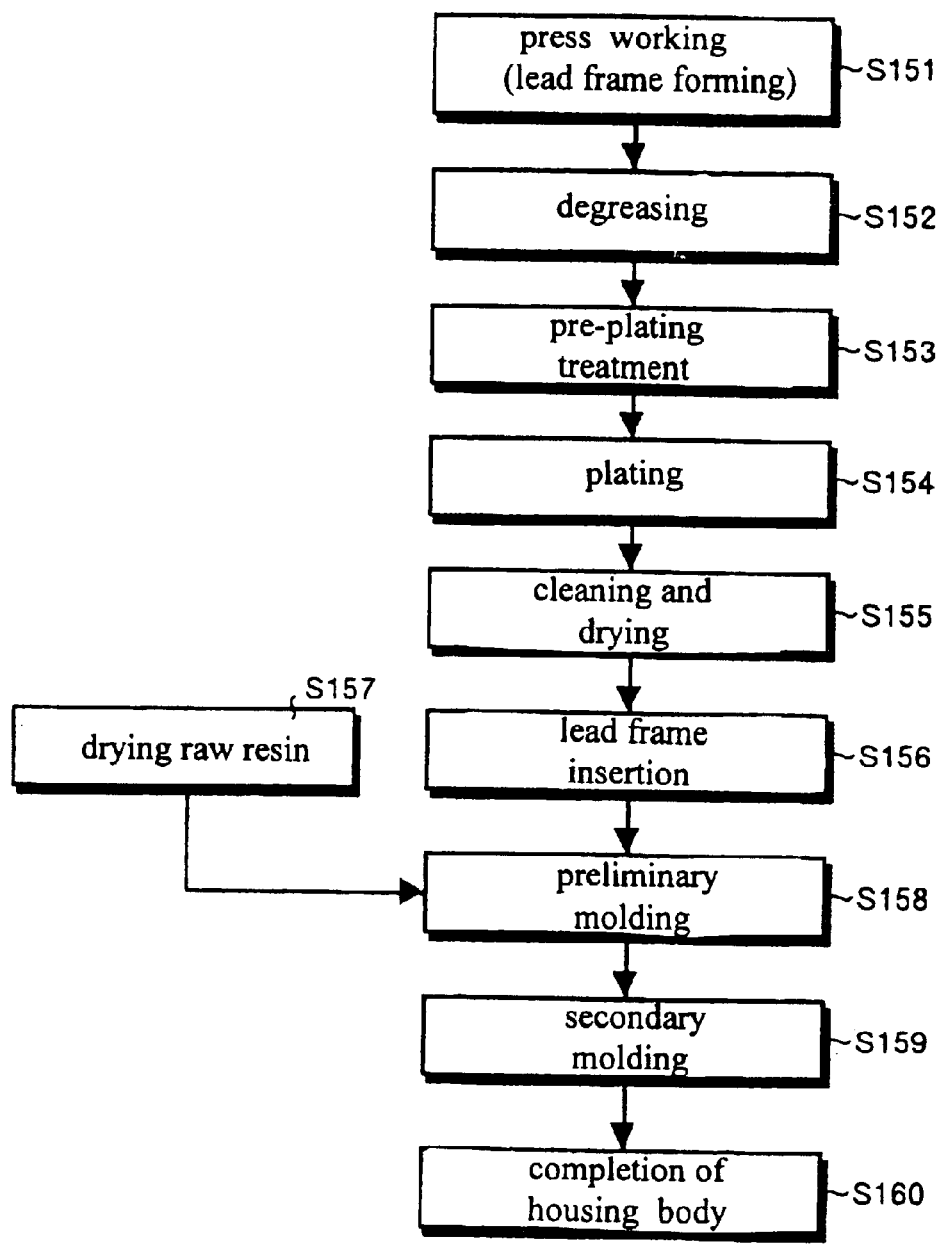
FIG. 15 is a flow diagram showing a manufacturing procedure of a housing body of a container for a semiconductor sensor illustrated in FIGS. 13 and 14.
Figure 16:
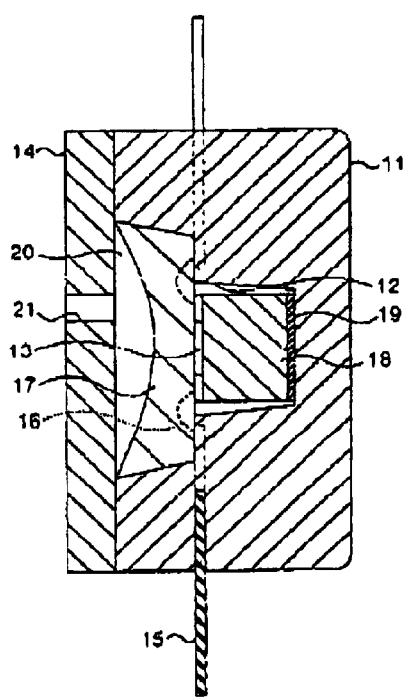
FIG. 16 is a cross-sectional view showing a construction of a conventional semiconductor sensor device.

FIG. 15 is a flow diagram showing the manufacturing procedure of the housing body 71. The steps of press working of the lead frame (step S151), degreasing (step S152), pre-plating treatment (step S153), plating (step S154), cleaning and drying step (step S155), setting a lead frame to a die (step S156), drying resin for preliminary molding (step S157), and injecting resin and molding (step S158) are same as in the first embodiment. Here, the step S158 is a preliminary molding step.

Then, a secondary molding is performed (step S159). After removing from the die, the housing body 71 is completed (step S160). To the thus manufactured housing body 71, a sensor unit is adhered that consists of a semiconductor pressure sensor chip 33 and a pedestal 38 fixing the chip. After conducting wire bonding, gel protective material 37 is filled, and a separately fabricated cover 34 is put on, to complete a pressure sensor device.

In the above-described third embodiment, clearance does not exist between the housing body 71 and the lead terminal 35, as in the first embodiment. Therefore, pressure leakage is avoided when calibration of the measuring pressure value is performed in the manufacturing process of a pressure sensor device, allowing accurate calibration. In addition, the sensor device is prevented from degradation due to escape of the gel protective material 37. When the preliminary molding is performed using a elastic resin such as silicone rubber, the resin absorbs strain generated by the difference in thermal expansion between the housing body 71 and the lead terminal 35. Consequently, the clearance between the housing body 71 and the lead terminal 35 is completely stopped up.

The present invention may be applied to acceleration sensor devices, temperature sensor devices, and devices for sensing other physical quantities, as well as pressure sensor devices.

According to the present invention, the overflowed gel protective material is trapped in the groove, to prevent the gel protective material from adhering to the portion of the housing body at which the cover contacts. Consequently, insufficient adhesion of the cover to the housing body due to overflow of the gel protective material is avoided. According to another feature of the invention, a recess portion or a protruding portion of the housing body respectively engages with a protruding portion or a recess portion of the cover when the cover is adhered to the housing body. Consequently, the cover is reliably adhered to the housing body.

Therefore, imperfect gas-tightness is prevented. According to another feature of the invention, the clearance between the housing body and the lead terminal is filled with filler, to eliminate the clearance. According to another feature of the invention, excess adhesive is allowed to release to the relief portion when a sensor unit is fixed to the housing body. Consequently, creeping up of the adhesive along the pedestal that fixes the sensor element is suppressed.

The invention has been described with reference to certain preferred embodiments thereof. It will be understood, however, that modification and variations are possible within the scope of the appended claims.

What is claimed is:

1. A container for a semiconductor sensor comprising:
   a housing body provided with a housing hollow for containing a sensor element; and
   a cover for closing said housing hollow,
   wherein said housing body is provided with a groove that is disposed on a portion of said housing body closed by said cover and inside of a portion of said housing body contacting to said cover, and surrounds a portion of said housing body outside of said housing hollow, and, wherein said housing body is provided with a relief portion for releasing excess adhesive from inner wall region of said housing hollow, said adhesive being used for fixing said sensor element to a bottom of said housing hollow.

2. A container for a semiconductor sensor comprising:

a housing body provided with a housing hollow for containing a sensor element; and a cover for closing said housing hollow;

wherein said housing body is provided with a recess portion or a protruding portion that is disposed on a portion of said housing body contacting said cover and surrounds a portion of said housing body outside of said housing hollow, wherein said cover is provided with a protruding portion or a recess portion that is disposed in a portion of said cover contacting said housing body and engages said recess portion or said protruding portion, respectively, of said housing body, and wherein said housing body is provided with a relief portion for releasing excess adhesive from inner wall region of said housing hollow, said adhesive being used for fixing said sensor element to a bottom of said housing hollow.

3. A container for a semiconductor sensor comprising:

a housing body provided with a housing hollow for containing a sensor element; and a cover for closing said housing hollow, wherein said housing body is provided with a groove that is disposed on a portion of said housing body closed by said cover and inside of a portion of said housing body contacting to said cover, and surrounds a portion of said housing body outside of said housing hollow, and with a recess portion or a protruding portion that is disposed on a portion of said housing body contacting said cover and surrounds a portion of said housing body outside of said housing hollow, wherein said cover is provided with a protruding portion or a recess portion that is disposed in a portion of said cover contacting said housing body and engages said recess portion or said protruding portion, respectively, of said housing body, and wherein said housing body is provided with a relief portion for releasing excess adhesive from inner wall region of said housing hollow, said adhesive being used for fixing said sensor element to a bottom of said housing hollow.

4. A container for a semiconductor sensor comprising:

a housing body provided with a housing hollow for containing a sensor element;

lead terminals penetrating through said housing body from inside to outside; and filler that fills clearance in boundary regions between surfaces of said housing body and said lead terminals, wherein said housing body is provided with a relief portion for releasing excess adhesive from inner wall region of said housing hollow, said adhesive being used for fixing said sensor element to a bottom of said housing hollow.

5. A container for a semiconductor sensor comprising:

a housing body provided with a housing hollow for containing a sensor element;

lead terminals penetrating through said housing body from inside to outside; and filler that fills clearance in boundary regions between said terminals and said housing body by coating a portion of said lead terminals that is embedded in interior of said housing body, wherein paid housing body is provided with a relief portion for releasing excess adhesive from inner wall region of said housing hollow, said adhesive being used for fixing said sensor element to a bottom of said housing hollow.

6. A container for a semiconductor sensor comprising:

a housing body provided with a housing hollow for containing a sensor element;

lead terminals penetrating through said housing body from inside to outside;

filler that fills clearance in boundary regions between surfaces of said housing body and said lead terminals; and a cover for closing said housing hollow, wherein said housing body is provided with a groove that is disposed on a portion of said housing body closed by said cover and inside of a portion of said housing body contacting to said cover, and surrounds a portion of said housing body outside of said housing hollow, and with a recess portion or a protruding portion that is disposed on a portion of said housing body contacting said cover and surrounds a portion of said housing body outside of said housing hollow, and wherein said cover is provided with a protruding portion or a recess portion that is disposed in a portion of said cover contacting said housing body and engages said recess portion or said protruding portion, respectively, of said housing body.

7. A container for a semiconductor sensor according to claim 6, wherein said housing body is provided with a relief portion for releasing excess adhesive from inner wall region of said housing hollow, said adhesive being used for fixing said sensor element to a bottom of said housing hollow.

8. A container for a semiconductor comprising:

a housing body provided with a housing hollow for containing a sensor element;

lead terminals penetrating through said housing body from inside to outside;

filler that fills clearance in boundary regions between said terminals and said housing body by coating a portion of said lead terminals that is embedded in interior of said housing body; and a cover for closing said housing hollow, wherein said housing body is provided with a groove that is disposed on a portion of said housing body closed by said cover and inside of a portion of said housing body contacting to said cover, and surrounds a portion of said housing body outside of said housing hollow, and with a recess portion or a protruding portion that is disposed on a portion of said housing body contacting said covet and surrounds a portion of said housing body outside of said housing hollow, and wherein said cover is provided with a protruding portion or a recess portion that is disposed in a portion of said cover contacting said housing body and engages said recess portion or said protruding portion, respectively, of said housing body.

9. A container for a semiconductor sensor according to claim 8, wherein said housing body is provided with a relief portion for releasing excess adhesive from inner wall region of said housing hollow, said adhesive being used for fixing said sensor element to a bottom of said housing hollow.

10. A container for a semiconductor sensor comprising a housing body provided with a housing hollow for containing a sensor element, wherein said housing body is provided with a relief portion for releasing excess adhesive from inner wall region of said housing hollow, said adhesive being used for fixing said sensor element to a bottom of said housing hollow.

11. A method for manufacturing a container for a semiconductor sensor, said container having a hawing body provided with a housing hollow for containing a sensor element and lead terminals penetrating through said housing body from inside to outside, said method comprising steps of:
   insert-molding said lead terminals and said housing body, and
   applying resin to boundary regions between surfaces of said housing body and said lead terminals after molding, to fill clearance existing at said boundary regions.

12. A method for manufacturing a container for a semiconductor sensor, said container having a housing body provided with a housing hollow for containing a sensor element and lead terminals penetrating said through housing body from inside to outside, said method comprising steps of:
   covering a portion of said lead terminals that is to be embedded in said housing body with resin films, and
   insert-molding said lead terminals and said housing body.

13. A method for manufacturing a container for a semiconductor sensor, said container having a housing body provided with a housing hollow for containing a sensor element and lead terminals penetrating through said housing body from inside to outside, said method comprising steps of:
   enclosing a portion of said lead terminals that is to be embedded in said housing body within resin by preliminary molding, and
   forming to a final form by performing secondary molding of said lead terminals and said housing body.

14. A semiconductor sensor device comprising:
   a semiconductor sensor element; and
   a container including a housing body provided with a housing hollow containing the sensor element, and a cover closing said housing hollow,
   wherein said housing body is provided with a groove that is disposed on a portion of said housing body closed by said cover and inside of a portion of said housing body contacting to said cover, and surrounds a portion of said housing body outside of said housing hollow, and
   wherein said housing body is provided with a relief portion for releasing excess adhesive from inner wall region of said housing hollow, said adhesive being used for fixing said sensor element to a bottom of said housing hollow.

15. A semiconductor sensor device according to claim 14, wherein said semiconductor sensor element is a pressure sensor element that converts pressure to an electric signal.

16. A semiconductor sensor device comprising:
   a semiconductor sensor element; and
   a container including a housing body provided with a housing hollow containing the sensor element, and a cover closing said housing hollow,
   wherein said housing body is provided with a recess portion or a protruding portion that is disposed on a portion of said housing body contacting said cover and surrounds a portion of said housing body outside of said housing hollow,
   wherein said cover is provided with a protruding portion or a recess portion that is disposed in a portion of said cover contacting said housing body end engages said recess portion or said protruding portion, respectively, of said housing body, and
   wherein said housing body is provided with a relief portion for releasing excess adhesive from inner wall region of said housing hollow, said adhesive being used for fixing said sensor element top bottom of said housing hollow.

17. A semiconductor sensor device according to claim 16, wherein said semiconductor sensor element is a pressure sensor element that converts pressure to an electric signal.

18. A semiconductor sensor device comprising:
   a semiconductor sensor element; and
   a container including a housing body provided with a housing hollow containing the sensor element, and a cover closing said housing hollow,
   wherein said housing body is provided with a groove that is disposed on a portion of said housing body closed by said cover and inside of a portion of said housing body contacting to said cover, and surrounds a portion of said housing body outside of said housing hollow, and with a recess portion or a protruding portion that is disposed on a portion of said housing body contacting said cover and surrounds a portion of said housing body outside of said housing hollow,
   wherein said cover is provided with a protruding portion or a recess portion that is disposed in a portion of said cover contacting said housing body and engages said recess portion or said protruding portion, respectively, of said housing body, and
   wherein said housing body is provided with a relief portion for releasing excess adhesive from inner wall region of said housing hollow, said adhesive being used for fixing said sensor element to a bottom of said housing hollow.

19. A semiconductor sensor device according to claim 18, wherein said semiconductor sensor element is a pressure sensor element that converts pressure to an electric signal.

20. A semiconductor sensor device comprising:
   a semiconductor sensor element; and
   a container including a housing body provided with a housing hollow containing the sensor element, lead terminals penetrating through said housing body from inside to outside, filler that fills clearance in boundary regions between surfaces of said housing body and said lead terminals, and a cover closing said housing hollow,
   wherein said housing body is provided with a relief portion for releasing excess adhesive from inner wall region of said housing hollow, said adhesive being used for fixing said sensor element to a bottom of said housing hollow.

21. A semiconductor sensor device according to claim 20, wherein said semiconductor sensor element is a pressure sensor element that converts pressure to an electric signal.

22. A semiconductor sensor device comprising:
   a semiconductor sensor element; and
   a container including a housing body provided with a housing hollow containing the sensor element, lead terminals penetrating through said housing body from inside to outside, filler that fills clearance in boundary regions between said terminals and said housing body by coating a portion of said lead terminals that is embedded in interior of said housing body, and a cover closing said housing hollow, wherein said housing body is provided with a relief portion for releasing excess adhesive from inner wall region of said housing hollow, said adhesive being used for fixing said sensor element to a bottom of said housing hollow.

23. A semiconductor sensor device according to claim 22, wherein said semiconductor sensor element is a pressure sensor element that converts pressure to an electric signal.

24. A semiconductor sensor device comprising:

a container for a semiconductor sensor including a housing body provided with a housing hollow for containing a sensor element, lead terminals penetrating through said housing body from inside to outside, filler that fills clearance in boundary regions between surfaces of said housing body and said lead terminals, and a cover for closing said housing hollow; and a semiconductor sensor element contained in said housing hollow provided in said housing body;

wherein said housing body is provided with a groove that is disposed on a portion of said housing body closed by said cover and inside of a portion of said housing body contacting to said cover, and surrounds a portion of said housing body outside of said housing hollow, and with a recess portion or a protruding portion that is disposed on a portion of said housing body contacting said cover and surrounds a portion of said housing body outside of said housing hollow; and wherein said cover is provided with a protruding portion or a recess portion that is disposed in a portion of said cover contacting said housing body and engages said recess portion or said protruding portion, respectively, of said housing body.

25. A semiconductor sensor device according to claim 24, wherein said semiconductor sensor element is a pressure sensor element that converts pressure to an electric signal.

26. A semiconductor sensor device comprising:

a container for a semiconductor sensor including a housing body provided with a housing hollow for containing a sensor element lead terminals penetrating through said housing body from inside to outside, filler that fills clearance in boundary regions between said terminals and said housing body by coating a portion of said lead terminals that is embedded in interior of said housing body, and a cover for closing said housing hollow; and a semiconductor sensor element contained in said housing hollow provided in said housing body;

wherein said housing body is provided with a groove that is disposed on a portion of said housing body closed by said cover and inside of a portion of said housing body contacting to said cover, and surrounds a portion of said housing body outside of said housing hollow, and with a recess portion or a protruding portion that is disposed on a portion of said housing body contacting said cover and surrounds a portion of said housing body outside of said housing hollow; and wherein said cover is provided with a protruding portion or a recess portion that is disposed in a portion of said cover contacting said housing body and engages said recess portion or said protruding portion, respectively, of said housing body.

27. A semiconductor sensor device according to claim 26, wherein said semiconductor sensor element is a pressure sensor element that converts pressure to an electric signal.

28. A semiconductor sensor device comprising:

a container for a semiconductor sensor including a housing body provided with a housing hollow for containing a sensor element, and a cover for closing said housing hollow;

lead terminals penetrating through said housing body from inside to outside;

a semiconductor sensor element fixed in said housing hollow;

bonding wires connecting said lead terminals and said sensor element; and filler that covers a portion of said lead terminals exposed to said housing hollow and a place of connecting said lead terminals and said bonding wires, and fills clearance in boundary regions between said lead terminals and said housing body on said housing hollow side;

wherein said housing body is provided with a groove that is disposed on a portion of said housing body closed by said cover and inside of a portion of said housing body contacting to said cover, and surrounds a portion of said housing body outside of said housing hollow.

29. A semiconductor sensor device according to claim 28, wherein said housing body is provided with a relief portion for releasing excess adhesive from inner wall region of said housing hollow, said adhesive being used for fixing said sensor element to a bottom of said housing hollow.

30. A semiconductor sensor device comprising:

a container for a semiconductor sensor including a housing body provided with a housing hollow for containing a sensor element, and a cover for closing said housing hollow;

lead terminals penetrating through said housing body from inside to outside;

a semiconductor sensor element fixed in said housing hollow;

bonding wires connecting said lead terminals and said sensor element; and filler that covers a portion of said lead terminals exposed to said housing hollow and a place of connecting said lead terminals and said bonding wires, and fills clearance in boundary regions between said lead terminals and said housing body on said housing hollow side;

wherein said housing body is provided with a recess portion or a protruding portion that is disposed on a portion of said housing body contacting said cover and surrounds a portion of said housing body outside of said housing hollow, and wherein said cover is provided with a protruding portion or a recess portion that is disposed in a portion of said cover contacting said housing body and engages said recess portion or said protruding portion, respectively, of said housing body.

31. A semiconductor sensor device according to claim 30, wherein said housing body is provided with a relief portion for releasing excess adhesive from inner wall region of said housing hollow, said adhesive being used for fixing said sensor element to a bottom of said housing hollow.

32. A semiconductor sensor device comprising:

a container for a semiconductor sensor including a housing body provided with a housing hollow for containing a sensor element, and a cover for closing said housing hollow;

lead terminals penetrating through said housing body from inside to outside;

a semiconductor sensor element fixed in said housing hollow;

bonding wires connecting said lead terminals and said sensor element; and filler that covers a portion of said lead terminals exposed to said bowing hollow and a place of connecting said lead terminals and said bonding wires, and fills clearance in boundary regions between said lead terminals and said housing body on said housing hollow side;

wherein said housing body is provided with a groove that is disposed on a portion of said housing body closed by said cover and inside of a portion of said housing body contacting to said cover, and surrounds a portion of said housing body outside of said housing hollow, and with a recess portion or a protruding portion that is disposed on a portion of said housing body contacting said cover and surrounds a portion of said housing body outside of said housing hollow; and wherein said cover is provided with a protruding portion or a recess portion that is disposed in a portion of said cover contacting said housing body and engages said recess portion or said protruding portion, respectively, of said housing body.

33. A semiconductor sensor device according to claim 32, wherein said housing body is provided with a relief portion for releasing excess adhesive from inner wall region of said housing hollow, said adhesive being used for fixing said sensor element to a bottom of said housing hollow.

34. A semiconductor sensor device comprising:

a housing body provided with a housing hollow for containing a sensor element;

lead terminals penetrating through said housing body from inside to outside;

a semiconductor sensor element fixed in said housing hollow;

bonding wires connecting said lead terminals and said sensor element; and filler that covers a portion of said lead terminals exposed to said housing hollow and a place of connecting said lead terminals and said bonding wires, and fills clearance in boundary regions between said lead terminals and said housing body on said housing hollow side, wherein said housing body is provided with a relief portion for releasing excess adhesive from inner wall region of said housing hollow, said adhesive being used for fixing said sensor element to a bottom of said housing hollow.

35. A semiconductor sensor device comprising:

a container for a semiconductor sensor including a housing body provided with a housing hollow for containing a sensor element;

a semiconductor sensor element and a pedestal fixing said sensor element, both contained in said housing hollow provided in said housing body of said container; and a cover closing said housing hollow;

wherein said pedestal functions to relax stress generated by difference in thermal expansion between said sensor element and said housing body; and wherein said housing body is provided with a relief portion for releasing excess adhesive from inner wall region of said housing hollow, said adhesive being used for fixing said sensor element to a bottom of said housing hollow.

36. A semiconductor sensor device according to claim 35, wherein said semiconductor sensor element is a pressure sensor element that converts pressure to an electric signal.

37. A semiconductor sensor device comprising:

a container for a semiconductor sensor including a housing body provided with a housing hollow for containing a sensor element, and a cover for closing said housing hollow; and a semiconductor sensor element and a pedestal fixing said sensor element, both contained in said housing hollow provided in said housing body of said container, wherein said pedestal functions to relax stress generated by difference in thermal expansion between said sensor element and said housing body;

wherein said housing body is provided with a groove that is disposed on a portion of said housing body closed by said cover and inside of a portion of said housing body contacting to said cover, and surrounds a portion of said housing body outside of said housing hollow; and wherein said housing body is provided with a relief portion for releasing excess adhesive from inner wail region of said housing hollow, said adhesive being used for fixing said sensor element to a bottom of said housing hollow.

38. A semiconductor sensor device according to claim 37, wherein said semiconductor sensor element is a pressure sensor element that converts pressure to an electric signal.

39. A semiconductor sensor device comprising:

a container for a semiconductor sensor including a housing body provided with a housing hollow for containing a sensor element, and a cover for closing said housing hollow; and a semiconductor sensor element and a pedestal fixing said sensor element, both contained in said housing hollow provided in said housing body of said container, wherein said pedestal functions to relax stress generated by difference in thermal expansion between said sensor element and said housing body;

wherein said housing body is provided with a recess portion or a protruding portion that is disposed on a portion of said housing body contacting said cover and surrounds a portion of said housing body outside of said housing hollow, wherein said cover is provided with a protruding portion or a recess portion that is disposed in a portion of said cover contacting said housing body and engages said recess portion or said protruding portion, respectively, of said housing body; and wherein said housing body is provided with a relief portion for releasing excess adhesive from inner wall region of said housing hollow, said adhesive being used for fixing said sensor element to a bottom of said housing hollow.

40. A semiconductor sensor device according to claim 39, wherein said semiconductor sensor element is a pressure sensor element that converts pressure to an electric signal.

41. A semiconductor sensor device comprising:

a container for a semiconductor sensor including a housing body provided with a housing hollow for containing a sensor element, and a cover for closing said housing hollow; and a semiconductor sensor element and a pedestal fixing said sensor element, both contained in said housing hollow provided in said housing body of said container;

wherein said pedestal functions to relax stress generated by difference in thermal expansion between said sensor element and said housing body;

wherein said housing body is provided with a groove that is disposed on a portion of said housing body closed by said cover and inside of a portion of said housing body contacting to said cover, and surrounds a portion of said housing body outside of said housing hollow, and with a recess portion or a protruding portion that is disposed on a portion of said housing body contacting said cover and surrounds a portion of said housing body outside of said housing hollow;

wherein said cover is provided with a protruding portion or a recess portion that is disposed in a portion of said cover contacting said housing body and engages said recess portion or said protruding portion, respectively, of said housing body; and wherein said housing body is provided with a relief portion for releasing excess adhesive from inner wall region of said housing hollow, said adhesive being used for fixing said sensor element to a bottom of said housing hollow.

42. A semiconductor sensor device according to claim 41, wherein said semiconductor sensor element is a pressure sensor element that converts pressure to an electric signal.

43. A semiconductor sensor device comprising:

a container for a semiconductor sensor including a housing body provided with a housing hollow for containing a sensor element, lead terminals penetrating through said housing body from inside to outside, and filler that fills clearance in boundary regions between surfaces of said housing body and said lead terminals;

a semiconductor sensor element and a pedestal fixing said sensor element, both contained in said housing hollow provided in said housing body of said container; and a cover closing said housing hollow;

wherein said pedestal functions to relax stress generated by difference in thermal expansion between said sensor element and said housing body; and wherein said housing body is provided with a relief portion for releasing excess adhesive from inner wall region of said housing hollow, said adhesive being wed for fixing said sensor element to a bottom of said housing hollow.

44. A semiconductor sensor device according to claim 43, wherein said semiconductor sensor element is a pressure sensor element that converts pressure to an electric signal.

45. A semiconductor sensor device comprising:

a container for a semiconductor sensor including a housing body provided with a housing hollow for containing a sensor element, lead terminals penetrating through said housing body from inside to outside, and filler that fills clearance in boundary regions between said terminals and said housing body by coating a portion of said lead terminals that is embedded in interior of said housing body;

a semiconductor sensor element and a pedestal fixing said sensor element, both contained in said housing hollow provided in said housing body of said container; and a cover closing said housing hollow;

wherein said pedestal functions to relax stress generated by difference in thermal expansion between said sensor element and said housing body; and wherein said housing body is provided with a relief portion for releasing excess adhesive from inner wall region of said housing hollow, said adhesive being used for fixing said sensor element to a bottom of said housing hollow.

46. A semiconductor sensor device according to claim 45, wherein said semiconductor sensor element is a pressure sensor element that converts pressure to an electric signal.

47. A semiconductor sensor device comprising:

a container for a semiconductor sensor including a housing body provided with a housing hollow for containing a sensor element, lead terminals penetrating through said housing body from inside to outside, filler that fills clearance in boundary regions between surfaces of said housing body and said lead terminals, and a cover for closing said housing hollow; and a semiconductor sensor element and a pedestal fixing said sensor element, both contained in said housing hollow provided in said housing body of said container;

wherein said pedestal functions to relax stress generated by difference in thermal expansion between said sensor element and said housing body;

wherein said housing body is provided with a groove that is disposed on a portion of said housing body closed by said cover and inside of a portion of said housing body contacting to said cover, and surrounds a portion of said housing body outside of said housing hollow, and with a recess portion or a protruding portion that is disposed on a portion of said housing body contacting said cover and surrounds a portion of said housing body outside of said housing hollow;

wherein said cover is provided with a protruding portion or a recess portion that is disposed in a portion of said cover contacting said housing body and engages said recess portion or said protruding portion, respectively, of said housing body; and wherein said housing body is provided with a relief portion for releasing excess adhesive from inner wall region of said housing hollow, said adhesive being used for fixing said sensor element to a bottom of said housing hollow.

48. A semiconductor sensor device according to claim 47, wherein said semiconductor sensor element is a pressure sensor element that converts pressure to an electric signal.

49. A semiconductor sensor device comprising:

a container for a semiconductor sensor including a housing body provided with a housing hollow for containing a sensor element, lead terminals penetrating through said housing body from inside to outside, filler that fills clearance in boundary regions between said terminals and said housing body by coating a portion of said lead terminals that is embedded in interior of said housing body, and a cover for closing said housing hollow; and a semiconductor sensor element and a pedestal fixing said sensor element, both contained in said housing hollow provided in said housing body of said container;

wherein said pedestal functions to relax stress generated by difference in thermal expansion between said sensor element and said housing body;

wherein said housing body is provided with a groove that is disposed on a portion of said housing body closed by said cover and inside of a portion of said housing body contacting to said cover, and surrounds a portion of said housing body outside of said housing hollow, and with a recess portion or a protruding portion that is disposed on a portion of said bowing body contacting said cover and surrounds a portion of said housing body outside of said housing hollow;

wherein said cover is provided with a protruding portion or a recess portion that is disposed in a portion of said cover contacting said housing body and engages said recess portion or said protruding portion, respectively, of said housing body; and wherein said housing body is provided with a relief portion for releasing excess adhesive from inner wall region of said housing hollow, said adhesive being used for fixing said sensor element to a bottom of said housing hollow.

50. A semiconductor sensor device according to claim 49, wherein said semiconductor sensor element is a pressure sensor element that converts pressure to an electric signal.

* * * * *